United States Patent
Mueller et al.

(10) Patent No.: US 7,229,694 B2
(45) Date of Patent: Jun. 12, 2007

(54) MICROMECHANICAL COMPONENT AND METHOD FOR PRODUCING AN ANTI-ADHESIVE LAYER ON A MICROMECHANICAL COMPONENT

(75) Inventors: Lutz Mueller, Aichtal (DE); Kersten Kehr, Zwota (DE); Markus Ulm, Sersheim (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/446,583

(22) Filed: May 27, 2003

(65) Prior Publication Data

US 2004/0033372 A1   Feb. 19, 2004

(30) Foreign Application Priority Data

May 25, 2002   (DE)   ............................. 102 23 359

(51) Int. Cl.
*B32B 9/04* (2006.01)

(52) U.S. Cl. .................. 428/447; 428/448; 428/688; 428/689; 438/50; 438/54; 257/414; 257/415; 257/467

(58) Field of Classification Search ................ 428/447, 428/448, 688, 689; 438/50, 54; 257/414, 257/415, 467
See application file for complete search history.

(56) References Cited

U.S. PATENT DOCUMENTS

| | | | | |
|---|---|---|---|---|
| 4,687,707 A | * | 8/1987 | Matsuo et al. | 428/336 |
| 4,992,300 A | | 2/1991 | Ogawa et al. | |
| 5,425,989 A | | 6/1995 | Ogawa et al. | |
| 5,694,740 A | | 12/1997 | Martin et al. | |
| 5,851,674 A | * | 12/1998 | Pellerite et al. | 428/421 |
| 2002/0064649 A1 | * | 5/2002 | Lembke et al. | 428/336 |

FOREIGN PATENT DOCUMENTS

| | | |
|---|---|---|
| EP | 0 474 228 | 5/1993 |
| EP | 845 301 | 6/1998 |
| WO | 01/57920 | 8/2001 |

* cited by examiner

*Primary Examiner*—Kuo-Liang Peng
(74) *Attorney, Agent, or Firm*—Kenyon & Kenyon LLP

(57) ABSTRACT

A micromechanical component includes an anti-adhesive layer, formed from at least one fluorine-containing silane, applied to at least parts of its surface for reducing surface forces. To increase mechanical and thermal load capacity, the anti-adhesive layer is provided as a multilayer coating which is formed from at least one metal oxide layer and at least one layer composed of at least one fluorine-containing silane.

12 Claims, 2 Drawing Sheets

MICROMECHANICAL COMPONENT AND METHOD FOR PRODUCING AN ANTI-ADHESIVE LAYER ON A MICROMECHANICAL COMPONENT

FIELD OF THE INVENTION

The present invention relates to a micromechanical component having an anti-adhesive, and to a method for producing an anti-adhesive layer on a micromechanical component in a chamber.

BACKGROUND INFORMATION

Reactive, fluorine-containing or aromatic silanes are commercially available. Such silanes react with OH groups present on component surfaces to produce thin adhesive silane layers having anti-adhesive, hydrophobic, oleophobic, etc. properties. These layers are applied to component surfaces to avoid or reduce surface forces which result in "sticking together" of two components which are moveably situated with respect to one another.

A coating process for depositing monolayers of fluorine-containing silanes from a gas phase (chemical vapor deposition) is referred to in European Patent Application No. 845 301.

Another gas phase coating process for producing anti-adhesive layers on surfaces of micromechanical components is referred to in U.S. Pat. No. 5,694,740. In this process silicone oils, among other materials, and fluorine-containing silanes are used for producing the coating on micromechanical components.

International Patent Application WO/01/57920 describes a gas phase coating process for applying anti-adhesive layers to wafers having micromechanical structures. Organic compounds, in particular organosilanes, are proposed as anti-adhesive layers in the cited document. In addition, it refers to the deposition of such materials in a coating cycle as a coating layer on wafers.

Using the available coating processes, monolayers or coatings made of a few layers of such silanes are produced on component surfaces, only a limited layer thickness being achievable, with the result that such coatings may be very sensitive with respect to mechanical stresses and are oxidatively or thermolytically destroyed at higher temperatures.

SUMMARY OF THE INVENTION

The micromechanical component according to the present invention is provided with an anti-adhesive layer which is stable and capable of withstanding high mechanical and thermal stress, so that its functional range is believed to be significantly extended in comparison with respect to mechanical stresses.

The mechanical and thermal load capacity is increased since the anti-adhesive layer is produced as a multilayer coating having at least one metal oxide layer and one layer composed of fluorine-containing silanes which are each applied to component surfaces.

By producing the anti-adhesive layer from at least one metal oxide layer and at least one fluorine-containing silane layer, a surface coating may be created on a micromechanical component having a sufficient layer thickness which has satisfactory mechanical and thermal strength and which thus provides long-lasting protection against undesired wetting and adhesion to other elements on the surfaces of the micromechanical component.

Using the exemplary method according to the present invention of producing an anti-adhesive layer on a micromechanical component in a chamber, a mechanically and thermally stable multilayer coating composed of at least one layer of fluorine-containing silanes and at least one metal oxide layer is produced, so that micromechanical components having any desired geometry are easily coated.

In addition, the exemplary method according to the present invention provides that micromechanical components of any arrangement or configuration may be provided with a coating which has good thermal and mechanical strength. The components to be coated may be present in subdivided form, or may be situated unsubdivided on complete wafers. Moreover, multiple wafers may be coated simultaneously in one coating process.

The exemplary method according to the present invention is believed to be particularly advantageous for components having surfaces which may be easily wetted and glued, since these surfaces are passivated by the coating.

DETAILED DESCRIPTION

Figure 1:
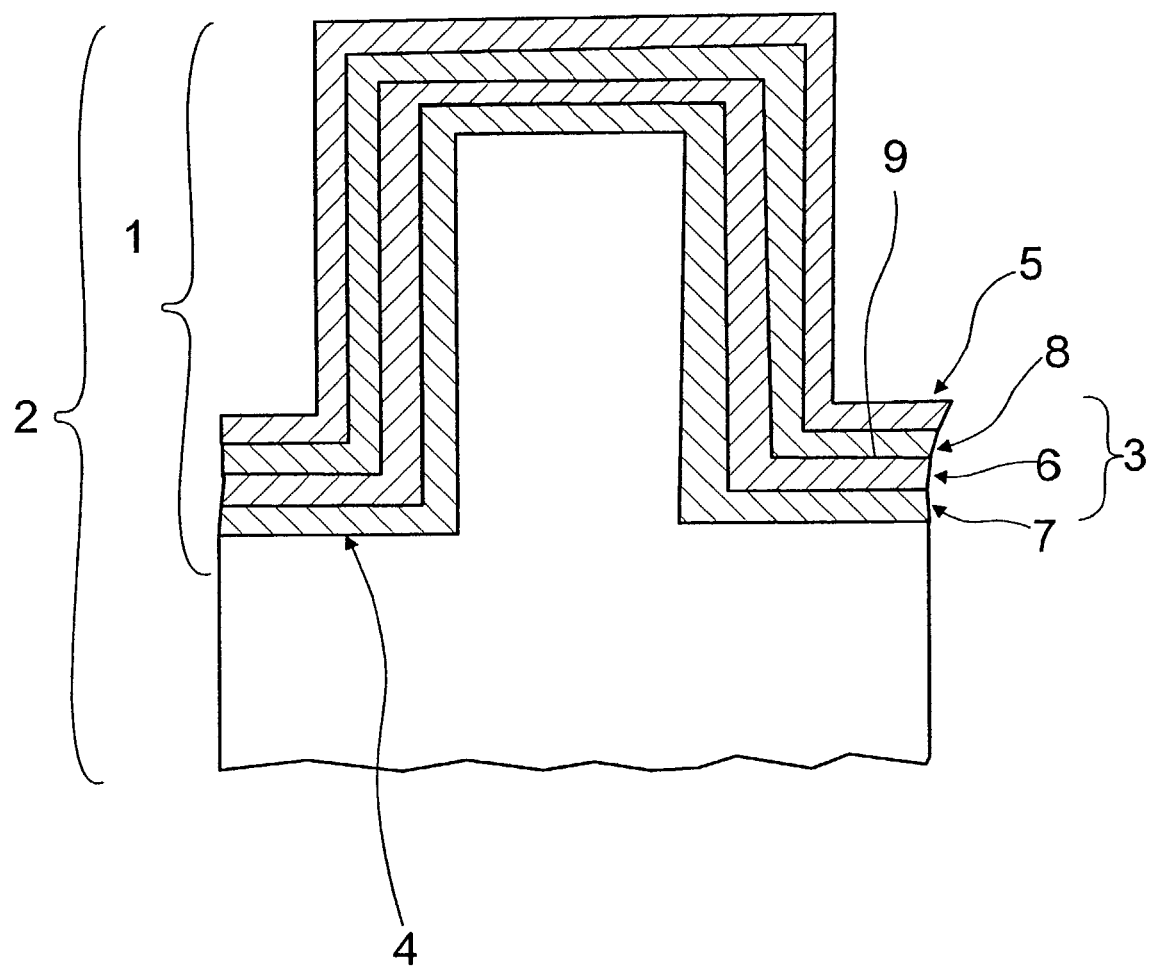
FIG. 1 shows a surface region of a micromechanical component, illustrated schematically and without observing the actual proportions, which is provided with an anti-adhesive layer provided as a multilayer coating.

FIG. 1 illustrates a surface region 1 of a micromechanical component 2 which is provided with an anti-adhesive layer 3 provided as a multilayer coating. Anti-adhesive layer 3 is provided as a protective layer and also as an "anti-stick layer," and in the present case is composed of two metal oxide layers 7, 8 and two layers 5, 6 made of fluorine-containing silanes which are situated alternating on surface region 1 of micromechanical component 2.

In this case, lower fluorine-containing silane layer 6 is not provided as a complete monolayer, as is the upper silane layer which forms cover layer 5 for anti-adhesive layer 3. Thus, in the plane of lower fluorine-containing silane layer 6 free regions remain on the surface of metal oxide layer 7 which provide reactive sites 9 for binding of metal oxide precursors to produce a firm bonding of metal oxide layer 8 to micromechanical component 2.

In the present case, individual layers 5, 6, 7, 8 of anti-adhesive layer 3 each have a layer thickness of approximately 20 nm, the layer thicknesses of the individual metal oxide layers and the individual fluorine-containing silane layers may range from 1 nm to 100 nm, depending on the particular application, and for anti-adhesive layer 3 to have a layer thickness from 3 nm to 300 nm.

Figure 2:
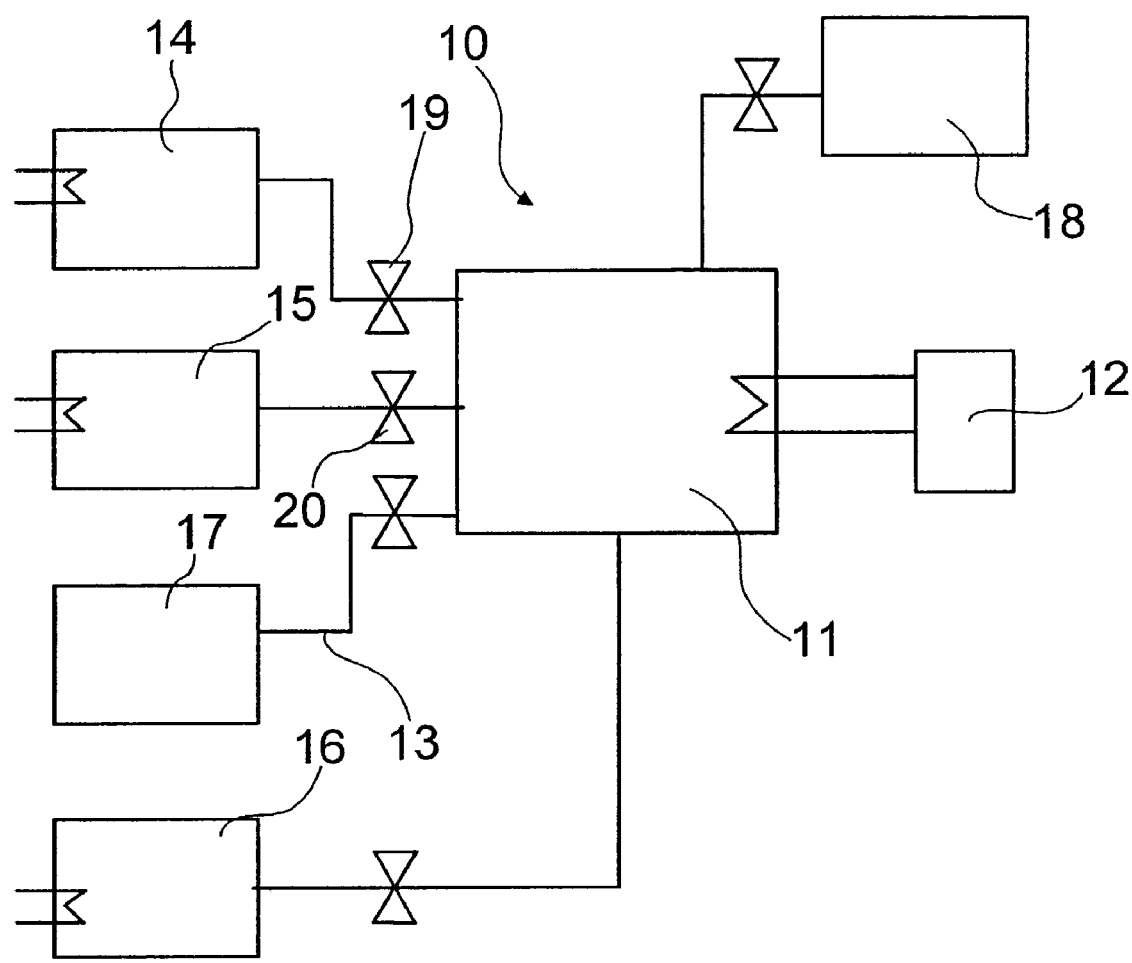
FIG. 2 shows a system diagram, in a greatly simplified illustration, of a system whereby an anti-adhesive layer is applied to a micromechanical component.

FIG. 2 is a highly schematic system diagram of a system 10 whereby anti-adhesive layer 3 is applied to a micromechanical component 2.

System 10 has a vacuum-tight chamber 11 having a heating and cooling device 12. In addition, chamber 11 is hydraulically connected to a nitrogen connection 13, multiple supply containers 14, 15, 16 which may be evacuated and which may be temperature-stabilized, and a supply container 17 for nitrogen. Supply containers 14 through 16 are provided for storing fluorine-containing silanes, water, and metal oxide precursors. In addition, a vacuum pump unit 18 is part of system 10, and enables a high vacuum to be created in chamber 11 and in supply containers 14 through 16.

In operation, system 10 is controlled by a system control device (not illustrated in greater detail), which may be program-controlled, the connecting lines between supply containers 14 through 16 and chamber 11, the connecting line between chamber 11 and vacuum pump unit 18, and the connecting lines between supply containers 14 through 16 and vacuum pump unit 18 (not illustrated in greater detail) each being provided with a valve. In addition, system 10 is made of corrosion-resistant material, which may be glass or stainless steel such as V4A, for example, and constructed vacuum-tight.

The components to be coated are cleaned before coating. To this end, the components are rinsed with or placed in a solution of a liquid oxidizing cleaning agent such as Caro's acid, i.e., 20 parts by volume of a 30% hydrogen peroxide solution mixed with 80 parts by volume concentrated sulfuric acid.

Alternatively, the components may be cleaned by boiling for one hour in a solution of one part by volume of a 30% hydrogen peroxide solution and 99 parts by volume water.

After completion of either of the two alternative cleaning processes, the components are rinsed with water and blown dry. The complete drying of the components to be coated, after cleaning and before the actual coating process, which may be accelerated by heating the components to a temperature ranging from 30° C. to 900° C.

As an alternative to wet chemical cleaning, the components may be cleaned before coating by using an oxygen plasma treatment.

The cleaned micromechanical components are introduced in chamber 11 for coating. To produce metal oxide layers 7,8 and fluorine-containing silane layers 5, 6 on surface 4 of a micromechanical component 2, it is necessary that OH groups be present on surface 4 of micromechanical component 2 and on subsequent layers 6, 7, 8 which enable the fluorine-containing silanes and the metal oxide precursors to chemically bond.

If the concentration of OH groups on surface 4 of micromechanical component 2 is not high enough, before coating the components with a metal oxide layer or a fluorine-containing silane layer, steam is introduced into chamber 11 for 3 minutes until the water vapor partial pressure in chamber 11 is 0.1 mbar to 20 mbar, for example. Excess steam is subsequently pumped out of chamber 11, which is then evacuated.

After evacuation, chamber 11 is flooded once or, if needed, several times with dry gaseous nitrogen and then re-evacuated so that the components to be coated are completely dry.

When chamber 11 has been evacuated, the vacuum being established in a range of 10 mbar to $10^{-9}$ mbar, which may be to a pressure of less than $10^{-4}$ mbar, valve 19 situated in the connecting line between chamber 11 and supply container 14 for the metal oxide precursor is opened. Thus, the vaporizing metal oxide precursor flows into chamber 11 during the time that valve 19 is open, and acts on the components to be coated.

The opening time for valve 19, or the connecting line between supply container 14 and chamber 11, is a few seconds up to several hours, depending on the particular application, the first intermediate layer or first metal oxide layer 7 being formed on surface 4 of micromechanical component 2 during this opening time.

After the first coating phase, excess metal oxide precursor and the hydrolysis products generated during the first coating phase, for example hydrogen chloride gas, are removed from chamber 11 by evacuation.

The chemically absorbed metal oxide precursor, i.e., metal oxide layer 7 is then completely hydrolyzed by the steam introduced into chamber 11, the hydrolysis products generated during the hydrolysis, for example hydrogen chloride gas and excess steam, again being removed from chamber 11 by evacuation.

The connecting line between supply container 15 in which the fluorine-containing silane compounds for producing silane layers 5, 6 are stored and chamber 11, or a valve 20, is subsequently opened so that the fluorine-containing silanes which vaporize due to the volume in chamber 11 act during a specified opening time on the components to be coated, and the first fluorine-containing silane layer 6 is deposited on metal oxide layer 7. The opening time may likewise be a few seconds up to several hours.

After this second coating phase, the vaporous excess fluorine-containing silanes and the hydrolysis products, for example hydrogen chloride gas, are removed from chamber 11 by evacuation.

After evacuation of chamber 11, steam is introduced into chamber 11 from supply container 16, thereby achieving complete hydrolysis of the chemically absorbed fluorine-containing silane in silane layer 6. The hydrolysis products thus generated and the excess steam are again removed from chamber 11 by evacuation.

The two coating phases described above constitute a coating cycle for producing the multilayer coating or anti-adhesive layer 3 on the surface of a micromechanical component 2; multilayer coating 3 may be produced using multiple coating cycles during which additional metal oxide layers 7, 8 and additional fluorine-containing silane layers are produced on component 2.

Alternatively, of course, after the first coating cycle an additional coating phase may be carried out, during which fluorine-containing silanes are further deposited on fluorine-containing silane layer 6 so that a complete monolayer composed of fluorine-containing silanes is present as a cover layer on the anti-adhesive layer.

After the coating is completed, chamber 11 is flooded at least once with dry gaseous nitrogen and then re-evacuated, thereby removing fluorine-containing silane residues in chamber 11 which were not deposited. The phase of ventilating chamber 11 with dry gaseous nitrogen and the subsequent evacuation may be carried out multiple times, which may be three times, if necessary, to remove all fluorine-containing silane residues from chamber 11.

The coated components are then removed from chamber 11, the removal may be performed without a previous cooling phase, or after a cooling phase, for the components in chamber 11. The components may subsequently undergo temperature stabilization, which may be in air for 10 minutes at 200° C. Of course, it is within the discretion of one skilled in the art to adjust the stabilization temperature and time differently, depending on the particular application.

As an alternative to the procedure described above, a component may be coated without producing vacuum in a chamber, the alternative procedure using a gas connection and multiple connections for supplying various process media; the procedure then need not be carried out in a vacuum-tight manner. The components to be coated are placed in the chamber and treated with dry inert carrier gas. The dry inert carrier gas is then passed through a liquid metal oxide precursor in a wash bottle and is thereby enriched with the metal oxide precursor which has been converted to the gaseous phase. The component(s) to be coated are then treated with the enriched carrier gas and steam. The chamber is then flushed with dry inert carrier gas and the component is treated with steam. After the steam treatment the chamber is flushed with dry inert carrier gas to remove the residual steam from the chamber.

The chamber flushing operation is followed by another coating phase for the component(s) using carrier gas enriched with fluorine-containing silanes, prior to this coating process the inert dry carrier gas being passed through and enriched by liquid fluorine-containing silanes in an additional wash bottle.

The chamber is flushed with dry inert carrier gas to ensure that the chamber is free of fluorine-containing silanes after the second coating phase. After the flushing phase, the coated components are treated with steam and removed from the chamber.

To generally accelerate formation of individual layers during the coating phases for a micromechanical component, the components to be coated may be heated to a temperature of 30° C. to 250° C., the temperature stabilization may take place under, or in the absence of, high vacuum in the chamber.

The concentrations of fluorine-containing silanes in the gaseous phase are adjusted by temperature stabilization of supply container 15 in a temperature range of −200° C. to +250° C., the layer formation may be influenced in this manner. In addition, deposition of the fluorine-containing silanes as well as the metal oxide precursors may be supported by a high-frequency plasma, i.e., by energy input. Furthermore, during the deposition the components to be coated may be cooled to a temperature of from −200° C. to +20° C., so as to improve the quality of anti-adhesive layer 3.

To recover the excess vaporous fluorine-containing silanes which have been discharged from vacuum-tight chamber 11, a cold trap (not illustrated in greater detail) may be inserted between chamber 11 and vacuum pump unit 18.

Alternatively, an exhaust air cleaner or an absorber containing aqueous alkaline solution may be installed downstream from vacuum pump unit 18 to remove excess fluorine-containing silanes and/or the metal oxide precursor from the exhaust gas.

The fluorine-containing silanes used for the coating of micromechanical components, or the silanes suitable for same, are vaporizable under high vacuum without decomposing, and have the general formula $R_a$—$R_b$—$Si(X)_{3-n}(R_c)_n$, in each case one fluorine-containing silane or several different fluorine-containing silanes may be used simultaneously for the coating. Variable $R_a$ stands for a perfluorinated polyether or a perfluorinated alkyl group containing 1 to 16 C atoms, which may be $C_6$ to $C_{12}$. Variable $R_b$ is an alkyl spacer, for example methyl or ethyl, and variable $R_c$ represents an alkyl group, for example methyl or ethyl. Variable X in the formula stands for a halogen, an acetoxy, or an alkoxy such as ethoxy or methoxy. Variable n has the values 0 to 2.

Compounds of fluorine-containing silanes particularly suited for producing the above-described silane layers are represented by 1,1,2,2-perfluorotetrahydrododecyltrichlorosilane, 1,1,2,2-perfluorotetrahydrododecyltrimethoxysilane, 1,1,2,2-tetrahydroperfluorododecyltrichlorosilane, 1,1,2,2-tetrahydroperfluorododecyltrimethoxysilane, 1,1,2,2-tetrahydroperfluorododecyltriacetoxysilane, 1,1,2,2-tetrahydroperfluorododecyltriethoxysilane, 1,1,2,2-tetrahydroperfluorooctyltrichlorosilane, 1,1,2,2-tetrahydroperfluorooctyltrimethoxysilane, 1,1,2,2-tetrahydroperfluorooctyltriethoxysilane, 1,1,2,2-perfluorotetrahydrohexyltrichlorosilane, 1,1,2,2-perfluorotetrahydrohexyltriethoxysilane, and 1,1,2,2-perfluorotetrahydrohexyltrimethoxysilane.

Compounds such as tetrachlorosilane, hexachlorodisilane, hexachlorodisiloxane, octachlorotrisiloxane, hexamethoxydisilane, tetramethoxysilane, tetraethoxysilane, tetraacetoxysilane, tin tetrachloride, boron trifluoride, boron trichloride, aluminum trichloride, or titanium tetrachloride are suitable as metal oxide precursors, the analogous alkoxy compounds and bromides likewise being suitable.

Two exemplary embodiments a, b for the coating of a micromechanical component are described below.

Exemplary Embodiment a:

The components to be coated were first cleaned for 60 minutes and then hydrated at 95° C. in a water-hydrogen peroxide solution containing 1% to 5% by volume hydrogen peroxide. The cleaned components or substrates were then blown dry with air and introduced in the coating system. Chamber 11 was evacuated to a pressure of less than $10^{-4}$ mbar at a substrate temperature of 55° C.

The components to be coated were then treated and coated in chamber 11 with tetrachlorosilane vapor at a tetrachlorosilane partial pressure of 1 mbar, over a period of 3 minutes at a substrate temperature of −4° C.

After this first coating phase, chamber 11 was evacuated to a pressure of less than $10^{-4}$ mbar at a substrate temperature of 55° C. The applied layer was then hydrolyzed with steam at a water vapor partial pressure of 10 mbar for 3 minutes at a substrate temperature of 55° C. The pressure in chamber 11 was then lowered to $10^{-4}$ mbar at a substrate temperature of 55° C., and the hydrolysis products and excess steam were pumped from chamber 11.

This was followed by a second coating phase using 1,1,2,2-tetrahydroperfluorodecyltrichlorosilane at a partial pressure of the coating agent of 0.1 mbar, over a period of 27 minutes at a substrate temperature of 0° C., and chamber 11 was subsequently re-evacuated at a substrate temperature of 55° C. until the internal pressure of chamber 11 was less than $10^{-4}$ mbar.

The fluorine-containing silane layer produced on the components during the second coating phase was completely hydrolyzed with steam at a water vapor partial pressure of 10 mbar, over a period of 12 minutes at a substrate temperature of 55° C., and chamber 11 was then re-evacuated at a substrate temperature of 55° C. until the internal pressure of chamber 11 was less than $10^{-4}$ mbar.

Over a period of 27 minutes the components to be coated were again acted on by 1,1,2,2-tetrahydroperfluorodecyltrichlorosilane at a partial pressure of the coating agent of 0.1 mbar, producing a silane cover layer which was formed at least as a complete monolayer in the third coating phase.

During a subsequent evacuation phase carried out at a substrate temperature of 55° C., the pressure in chamber 11 was lowered to less than $10^{-4}$ mbar, and the excess fluorine-containing silanes were pumped from chamber 11.

The chemically absorbed fluorine-containing silane layer was then completely hydrolyzed with steam at a water vapor partial pressure of 20 mbar, for 12 minutes at a substrate temperature of 55° C., and the excess water and hydrolysis products were subsequently pumped from chamber 11.

Components 2 to be coated had a surface 4 composed of silicon dioxide, thereby forming an anti-adhesive layer or an anti-adhesive layer 3 provided as a multilayer coating which had an advancing contact angle of 112° and a receding contact angle of 95° with respect to water. The thermal resistance of such layers was found to be extraordinarily high, and anti-adhesive layer 3 which was produced was still active after 400 hours in air at 300° C.

Exemplary Embodiment b:

Components 2 to be coated were cleaned using an oxygen plasma treatment, which may be for 5 minutes at 350 W and 1 torr, and were then introduced into chamber 11 of coating system 10. Chamber 11 was evacuated to a pressure of less than $10^{-4}$ mbar at a substrate temperature of 55° C. Steam at a water vapor partial pressure of 8 mbar was then introduced, over a period of 3 minutes at a substrate temperature of 55° C., to increase the density of the necessary OH groups on the surface of the components to be coated.

Chamber 11 was then evacuated to a pressure of $10^{-4}$ mbar at a substrate temperature of 55° C. This was followed by a first 10-minute coating phase using tetrachlorosilane at a partial pressure of the coating agent of 8 mbar and a substrate temperature of 55° C.

After the first coating phase was completed, chamber 11 was evacuated to a pressure of less than $10^{-4}$ mbar at a substrate temperature of 55° C. The applied layer was then completely hydrolyzed with steam at a water vapor partial pressure of 20 mbar, for 15 minutes at a substrate temperature of 55° C., and chamber 11 was then evacuated to a pressure of less than $10^{-4}$ mbar at a substrate temperature of 55° C.

This was followed by a second 10-minute coating phase carried out at a substrate temperature of 55° C., and the components to be coated were acted on and coated by 1,1,2,2-tetrahydroperfluorodecyltrichlorosilane at a partial pressure of the coating agent of 0.5 mbar. Chamber 11 was then evacuated to a pressure of less than $10^{-4}$ mbar at a substrate temperature of 55° C. The fluorine-containing silane layer was subsequently completely hydrolyzed with steam introduced into chamber 11 at a water vapor partial pressure of 20 mbar, for 5 minutes at a substrate temperature of 55° C. After the complete hydrolysis of the fluorine-containing silane layer, chamber 11 was evacuated to a pressure of less than $10^{-4}$ mbar at a substrate temperature of 55° C.

During a third 20-minute coating phase, the components to be coated were coated with a metal oxide layer, using tetrachlorosilane at a partial pressure of the coating agent of 8 mbar and a substrate temperature of 50° C.

Chamber 11 was subsequently evacuated to a pressure of less than $10^{-4}$ mbar at a substrate temperature of 55° C. and the metal oxide layer was then completely hydrolyzed with steam at a water vapor partial pressure of 20 mbar for 5 minutes at a substrate temperature of 55° C. The hydrolysis products and excess steam were pumped out in a subsequent evacuation phase which was carried out to a pressure of less than $10^{-4}$ mbar at a substrate temperature of 55° C.

During a fourth 20-minute coating phase the components to be coated, at a substrate temperature of 55° C., were acted on and coated with 1,1,2,2-tetrahydroperfluorodecyltrichlorosilane at a partial pressure of the coating agent of 0.5 mbar, and chamber 11 was then evacuated to a pressure of less than $10^{-4}$ mbar at a substrate temperature of 55° C.

The fluorine-containing silane layer produced during the fourth coating phase was completely hydrolyzed with steam introduced at a water vapor partial pressure of 20 mbar for 5 minutes at a substrate temperature of 55° C., and chamber 11 was then evacuated to a pressure of less than $10^{-4}$ mbar at a substrate temperature of 55° C.

After hydrolysis of the fluorine-containing silane layer, the components to be coated were acted on and coated by 1,1,2,2-tetrahydroperfluorodecyltrichlorosilane at a partial pressure of the coating agent of 0.5 mbar during a 10-minute coating phase, and excess fluorine-containing silanes were pumped out in a subsequent evacuation phase to a pressure of less than $10^{-4}$ mbar at a substrate temperature of 55° C.

The fluorine-containing silane layer produced during the fifth coating phase was completely hydrolyzed with steam introduced at a water vapor partial pressure of 20 mbar for 5 minutes at a substrate temperature of 55° C., the hydrolysis products and excess steam were pumped out in a subsequent evacuation phase at a substrate temperature of 55° C., and the internal pressure of chamber 11 was reduced to a pressure of less than $10^{-4}$ mbar.

Use of the above-described coating cycle resulted in an anti-adhesive multilayer coating or an anti-adhesive layer, on the components to be coated which were manufactured from silicon, which had an advancing contact angle greater than 115° with respect to water and which was still active after 0.5 hours under protective gas at a temperature of 400° C.

A temperature of an internal wall of chamber 11 which may be adjusted to 55° C. when the two embodiments are carried out. Of course, this temperature may be adjusted to a different suitable value.

The partial pressures of the coating agents and the steam may be adjusted to be different from the values given in embodiments a, b, depending on the particular application.

The components to be coated may be micromechanical sensors and actuators which may be coated on a wafer level, i.e., as complete silicon discs with sensor chips, or also on a die level after being subdivided. The subdivided components, i.e. chips or "dies," unsubdivided components, i.e., chips on wafers, or a large number of wafers with chips, i.e., entire batches, may be coated in a coating process. As a specialized application, use of the applied anti-adhesive layer is proposed in particular for protecting a micromechanical hot-film air mass sensor from contamination, and for protecting micromechanical inertial sensors, such as acceleration sensors or rotation rate sensors, from sticking.

Another specialized application results for micromechanical capacitive high-frequency switches having two switching states. In one of the two switching states, the metallic bridge which rests on a thin dielectric layer is deflected intentionally and by the switching voltage. When the switching voltage is turned off the switch should return to its original state, in which surface forces are undesired and are significantly reduced by the above-described anti-adhesive layer. In this case the layer thicknesses of an applied anti-adhesive layer should be less than 30 nm so as not to increase the capacitance of the micromechanical capacitive high-frequency switch. It is practical for the deposition of the anti-adhesive layer, i.e., the metal oxide layers and the fluorine-containing silane layers, to be carried out following manufacture of the switching elements, i.e., after the bridge is released by removal of the sacrificial layer, but before packaging.

Such micromechanical capacitive high-frequency switches, micromechanical hot-film air mass sensors, and micromechanical inertial sensors having the above-described anti-adhesive layer provided as a multilayer coating are provided with low surface forces in addition to a high mechanical stability, which has great advantages compared to the available anti-adhesive layers. In particular, micromechanical capacitive high-frequency switches are used in practice in radar systems (ACC, SRR) as well as in individual components.

Of course, a greater or smaller number of layers may be provided which depart from the number of individual metal oxide layers and fluorine-containing silane layers illustrated in FIG. 1. A metal oxide layer and a fluorine-containing silane layer, provided as a monolayer coating and placed on the metal oxide layer by multiple depositions, may form the anti-adhesive layer on surface 14 of micromechanical component 2.

In addition, more than two metal oxide layers and more than two fluorine-containing silane layers may be provided in an alternating manner on surface 4 to produce the anti-adhesive layer, the cover layer of the anti-adhesive layer once again being formed by a monolayer composed of fluorine-containing silanes.

What is claimed is:

1. A micromechanical component comprising:
an anti-adhesive layer, formed from at least one fluorine-containing silane applied to at least a part of a surface of the component, for reducing surface adhesive forces, wherein, to increase its mechanical and thermal load capacity, the anti-adhesive layer is a multilayer coating which is formed from at least two metal oxide layers and at least two layers composed of the at least one fluorine-containing silane, wherein the anti-adhesive layer is formed from metal oxide layers and fluorine-containing silane layers which are alternately situated.

2. The micromechanical component of claim 1, wherein a cover layer on the anti-adhesive layer is a complete monolayer from the at least one fluorine-containing silane.

3. The micromechanical component of claim 1, wherein a lower silane layer of the at least two layers has free reactive regions to which a metal oxide precursor to the at least two metal oxide layers binds.

4. The micromechanical component of claim 1, wherein a layer thickness of the at least two metal oxide layers and of a silane layer of the at least two layers ranges from 1 nm to 100 nm.

5. The micromechanical component of claim 1, wherein a fluorine-containing silane layer of the at least two layers is formed in each case from the at least one fluorine-containing silane which are reactive and which are vaporizable under high vacuum without decomposing.

6. The micromechanical component of claim 1, wherein the at least one fluorine-containing silane used to produce a fluorine-containing silane layer of the at least two layers are of a formula $R_a$—$R_b$—$Si(X)_{3-n}(R_c)_n$, $R_a$ being one of a perfluorinated polyether and a perfluorinated alkyl group containing 1 to 16 C atoms, $R_b$ being an alkyl spacer, $R_c$ being an alkyl group, X being one of a halogen, an acetoxy, and an alkoxy, and n having a value from 0 to 2.

7. The micromechanical component of claim 6, wherein $R_a$ contains one of $C_6$, $C_7$, $C_8$, $C_9$, $C_{10}$, $C_{11}$ and $C_{12}$.

8. The micromechanical component of claim 6, wherein the alkyl spacer is one of methyl and ethyl.

9. The micromechanical component of claim 6, wherein the alkyl group $R_c$ is one of methyl and ethyl.

10. A micromechanical component comprising:
an anti-adhesive layer, formed from at least one fluorine-containing silane applied to at least a part of a surface of the component, for reducing surface adhesive forces, wherein, to increase its mechanical and thermal load capacity, the anti-adhesive layer is a multilayer coating which is formed from at least two metal oxide layers and at least two layers composed of the at least one fluorine-containing silane, wherein the anti-adhesive layer is formed from metal oxide layers and fluorine-containing silane layers which are alternately situated, wherein metal oxide precursors used to produce the at least two metal oxide layers are at least one of tetramethoxysilane, tetraethoxysilane, tetraacetoxysilane, tin tetrachloride, boron trifluoride, boron trichloride, aluminum trichloride, titanium tetrachloride, analogous alkoxy compounds and bromides, and a mixture thereof.

11. A micromechanical component comprising:
an anti-adhesive layer, formed from at least one fluorine-containing silane applied to at least a part of a surface of the component, for reducing surface adhesive forces, wherein, to increase its mechanical and thermal load capacity, the anti-adhesive layer is a multilayer coating which is formed from at least two metal oxide layers and at least two layers composed of the at least one fluorine-containing silane, wherein the micromechanical component is one of a micromechanical hot-film air mass sensor and a micromechanical inertial sensor, wherein the anti-adhesive layer is formed from metal oxide layers and fluorine-containing silane layers which are alternately situated.

12. A micromechanical component comprising:
an anti-adhesive layer, formed from at least one fluorine-containing silane applied to at least a part of a surface of the component, for reducing surface adhesive forces, wherein, to increase its mechanical and thermal load capacity, the anti-adhesive layer is a multilayer coating which is formed from at least two metal oxide layers and at least two layers composed of the at least one fluorine-containing silane, wherein the micromechanical component is one of a micromechanical capacitive high-frequency switch, wherein the anti-adhesive layer is formed from metal oxide layers and fluorine-containing silane layers which are alternately situated.

* * * * *